(12) United States Patent (10) Patent No.: US 12,665,612 B2
Noble et al. (45) Date of Patent: Jun. 23, 2026

---

(54) COMPRESSION METHOD FOR QUBOS AND ISING MODELS

(71) Applicant: Dell Products L.P., Round Rock, TX (US)

(72) Inventors: Diego Vrague Noble, Pelotas (BR); Ítalo Gomes Santana, Rio de Janeiro (BR); Miguel Paredes Quiñones, Campinas (BR); Rômulo Teixeira De Abreu Pinho, Niterói (BR)

(73) Assignee: Dell Products L.P., Round Rock, TX (US)

( * ) Notice: Subject to any disclaimer, the term of this patent is extended or adjusted under 35 U.S.C. 154(b) by 229 days.

(21) Appl. No.: 18/541,025

(22) Filed: Dec. 15, 2023

(65) Prior Publication Data

US 2025/0202500 A1 Jun. 19, 2025

(51) Int. Cl.
  H03M 7/00 (2006.01)
  G06F 1/03 (2006.01)
  H03M 7/30 (2006.01)
(52) U.S. Cl.
  CPC ............ H03M 7/6011 (2013.01); G06F 1/03 (2013.01)
(58) Field of Classification Search
  CPC ............................. H03M 7/6011; G06F 1/03

USPC ...................................................... 341/50, 51
See application file for complete search history.

(56) References Cited

U.S. PATENT DOCUMENTS

| | | | | |
|---|---|---|---|---|
| 8,977,576 B2 * | 3/2015 | Macready | .............. | G06N 10/60 |
| | | | | 706/12 |
| 11,481,198 B2 * | 10/2022 | Sadowski | ................. | G06F 8/40 |
| 2012/0089654 A1 * | 4/2012 | Schweid | ................... | G06F 1/03 |
| | | | | 708/204 |
| 2018/0246851 A1 * | 8/2018 | Zaribafiyan | ............ | G06N 10/60 |
| 2021/0286955 A1 * | 9/2021 | Scharnbacher | ......... | G06F 9/454 |
| 2024/0126834 A1 * | 4/2024 | Krellner | ................. | G06F 17/16 |

* cited by examiner

*Primary Examiner* — Jean B Jeanglaude
(74) *Attorney, Agent, or Firm* — Workman Nydegger

(57) ABSTRACT

An original problem, which may be represented as a string, for execution in a quantum computing system is classically compressed using classical computing systems. Unique variable names and unique coefficients stored in tables constructed from the original problem are associated with unique identifiers. The problem is then translated to a translated form, such as a translated string, using the tables. The translated string may also be generated after quantizing values in the at least one of the tables. The translated string, whether or not quantized, may be entropy encoded. The final result is a compressed version or string of the original string that can be transmitted and stored in a compressed form. The compressed problem may also be decompressed and submitted for execution in a quantum computing system.

18 Claims, 8 Drawing Sheets

Construct Lookup Tables from Input
402

Perform Mapping Using the Tables
404

Perform Quantization for Lossy
Compression or Skip Quantization for
Lossless Compression
406

Perform Compression with Compressor
408

400

450

| Qubits | density | quantization factor | maxsize_variable_name | original size (MB) | 7z only (MB) | 7zip + algo (MB) | gain | lossless? |
|---|---|---|---|---|---|---|---|---|
| 5000 | 1 | 0 | 30 | 698 | 147 | 105 | 40 | Yes |
| 5000 | 1 | 0 | 5 | 235 | 72 | 66 | 9.090909 | Yes |
| 5000 | 1 | 0.5 | 30 | 703 | 146 | 88 | 65.90909 | No |
| 5000 | 1 | 0.5 | 5 | 237 | 72 | 59 | 22.0339 | No |
| 5000 | 1 | 0.75 | 30 | 698 | 145 | 71 | _104.2254_ | No |
| 5000 | 1 | 0.75 | 5 | 235 | 70 | 48 | 45.833333 | No |
| 5000 | 0.5 | 0 | 30 | 355 | 75 | 64 | 17.1875 | Yes |
| 5000 | 0.5 | 0 | 5 | 134 | 41 | 42 | -2.38095 | Yes |
| 5000 | 0.5 | 0.5 | 30 | 361 | 75 | 57 | 31.57895 | No |
| 5000 | 0.5 | 0.5 | 5 | 130 | 40 | 37 | 8.108108 | No |
| 5000 | 0.5 | 0.75 | 30 | 355 | 73 | 47 | 55.31915 | No |
| 5000 | 0.5 | 0.75 | 5 | 136 | 41 | 34 | 20.58824 | No |
| Average | | | | | | | 34.79113 | |

COMPRESSION METHOD FOR QUBOS AND ISING MODELS

FIELD OF THE INVENTION

Embodiments of the present invention generally relate to systems and methods for compression related operations in the context of quantum computing systems. More particularly, at least some embodiments of the invention relate to systems, hardware, software, computer-readable media, and methods for compressing models including models used by quantum computing operations.

BACKGROUND

The amount of data that exists in computing networks is continually increasing. The increase in the amount of data is associated with corresponding increases in data transmission and data storage. Both of these lead to increased costs. To address the problems associated with data storage and data transmission requirements, the data may be compressed prior to transmission or storage. Because the size of compressed data is smaller than the size of the original data, transmitting compressed data consumes less bandwidth and storing compressed data required less storage space.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings, in which:

FIG. 5B discloses aspects of a gain achieved by compressing a problem instance;

DETAILED DESCRIPTION OF SOME EXAMPLE EMBODIMENTS

Embodiments of the present invention generally relate to quantum computing. More particularly, at least some embodiments of the invention relate to systems, hardware, software, computer-readable media, and methods for compressing models or problems including quadratic binary models (QBMs).

In the context of quantum annealers, QBMs are a general class of problems used by quantum annealers to sample solutions for a given problem. QUBOs (quadratic unconstrained binary optimization models), which are a type of QBM, are often stored in lengthy plain text files for the convenience of debugging and validation. However, after these QUBO models are validated, there may be a need to transmit the QUBO over a network or store the QUBO in storage.

In general, example embodiments of the invention relate to compressing QUBO models. Embodiments of the invention are discussed in the context of problem instances such as QUBO models, but may be applied to other models or problem instances such as Ising models. Embodiments of the invention are also discussed in the context of quantum computing systems such as physical and simulated quantum annealers. Simulated quantum annealers are executed in classical computing systems.

Embodiments of the invention relate to compressing QUBOs. QUBOs may be compressed, for example, prior to transmission or storage. Embodiments of the invention further relate to lossy and/or lossless QUBO compression. QUBOs may be decompressed prior to execution.

Figure 1:
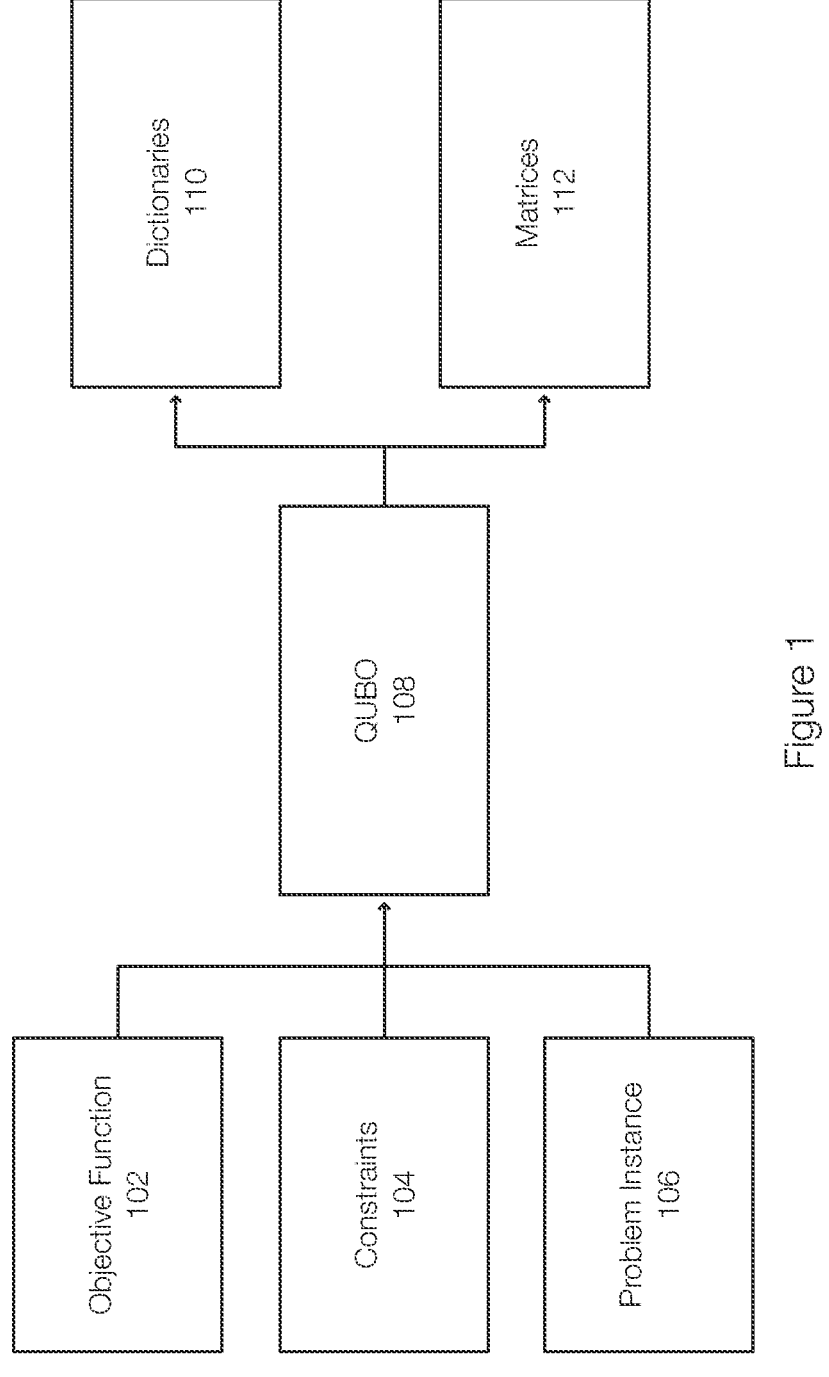
FIG. 1 discloses aspects of a problem instance for a quantum computing system.

FIG. 1 discloses aspects of a QUBO. FIG. 1 illustrates an example where an objective function 102, constraints 104, and a problem instance 106 are transformed into a QUBO 108. The objective function 102 mathematically expresses a problem using binary values. For example, an objective function may be represented as:

$$Q(x) = \sum_{i=1}^{N} q_i x_i + \sum_{j=i+1}^{N} q_{ij} x_i x_j.$$

As illustrated, the objective function 102 may include a linear term and a quadratic term. When solving a QUBO, the goal is to identify the variable assignments that minimize the objective function 106. A QUBO may have a large number of variables and the process of determining or identifying a solution may attempt to select a best known or optimal solution from all of the possible combinations.

Although a QUBO may be unconstrained, the constraints 104 are often introduced. The constraints 106 may ensure that some solutions are avoided. For example, the constraints 104 may be configured to penalize solutions that violate the constraints. The problem instance 106 may be a specific representation of a general problem definition in one example.

Thus, in one example, the objective function 102, the constraints 104, and the problem instance 106 are transformed into the QUBO 108. The QUBO 108 may be represented in various formats or forms such dictionaries 110 and/or matrices 112.

Figure 2:
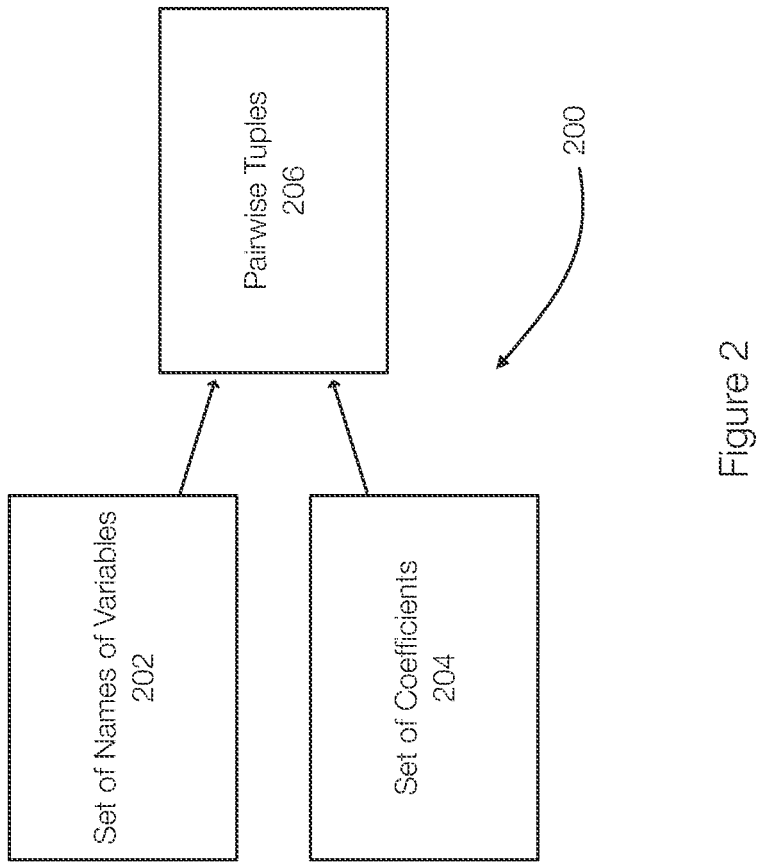
FIG. 2 discloses aspects of an example dictionary representation of a problem instance.

FIG. 2 discloses aspects of a dictionary representation of a QUBO. The QUBO 200 may include a set 202 (V) of variable names and a set 204 (C) of coefficients. These variable names are typically strings of characters that act as the placeholders for the values which the quantum annealer will find while coefficients are numeric values. The variable names 202 may be organized in tuples 206 ($v_i$, $v_j$) that indicate pairwise relationships. Each tuple is associated with a coefficient $c_k \in C$, which denotes a strength of the pair in the Hamiltonian that is encoded by the QUBO. This may be represented as: ($v_i$, $v_j$): $c_k$. The tuples could be represented as triples or in other forms. A template for a QUBO instance I, in one example, is a set of pairs of tuples and coefficients in the form of $$QUBO(I) = \{(v_i, v_j): c_k, \dots \}.$$

Depending on the problem represented by the QUBO, the variable names can be large strings such as "New York City, New York" or smaller such "x0". Also, these variable names may be duplicated in various parts of the QUBO, particularly in dense QUBOs (i.e., QUBOs whose number of pairs approach all possible combinations of n variables, which is $n*(n-1)/2$). Coefficients may also be duplicated in the QUBO dictionaries or other representations.

Embodiments of the invention relate to reducing the duplicated variable names and/or the granularity of the coefficients. This can reduce the redundancy of information in the QUBO. Generally, embodiments of the invention may construct a table representing or including the variable names and a table representing or including the coefficients. These tables allow the variable name or coefficient to be associated with an index value. In effect, each unique variable names and each unique coefficient are associated with a unique value, such as an index value. These tables are used to translate the original QUBO into a translated QUBO. Stated differently, when the original QUBO is represented as a string or an original string, the tables are used to translate the original string into a translated string.

When the compression operation is completed, these tables are attached to the encoded or compressed result (e.g., file) and may be used to decompress the compressed QUBO. In one embodiment, entropy encoding may be performed to the translated QUBO and the tables to generate a compressed result. If desired, another level of compression could be performed on the output of entropy encoding. The final compressed result may be a string of 1s and 0s.

As previously stated, real-size QUBO problems may have large storage requirements and may require a large bandwidth to transmit the QUBOs over networks. Compressed QUBOs more efficiently use these resources.

Figure 3:
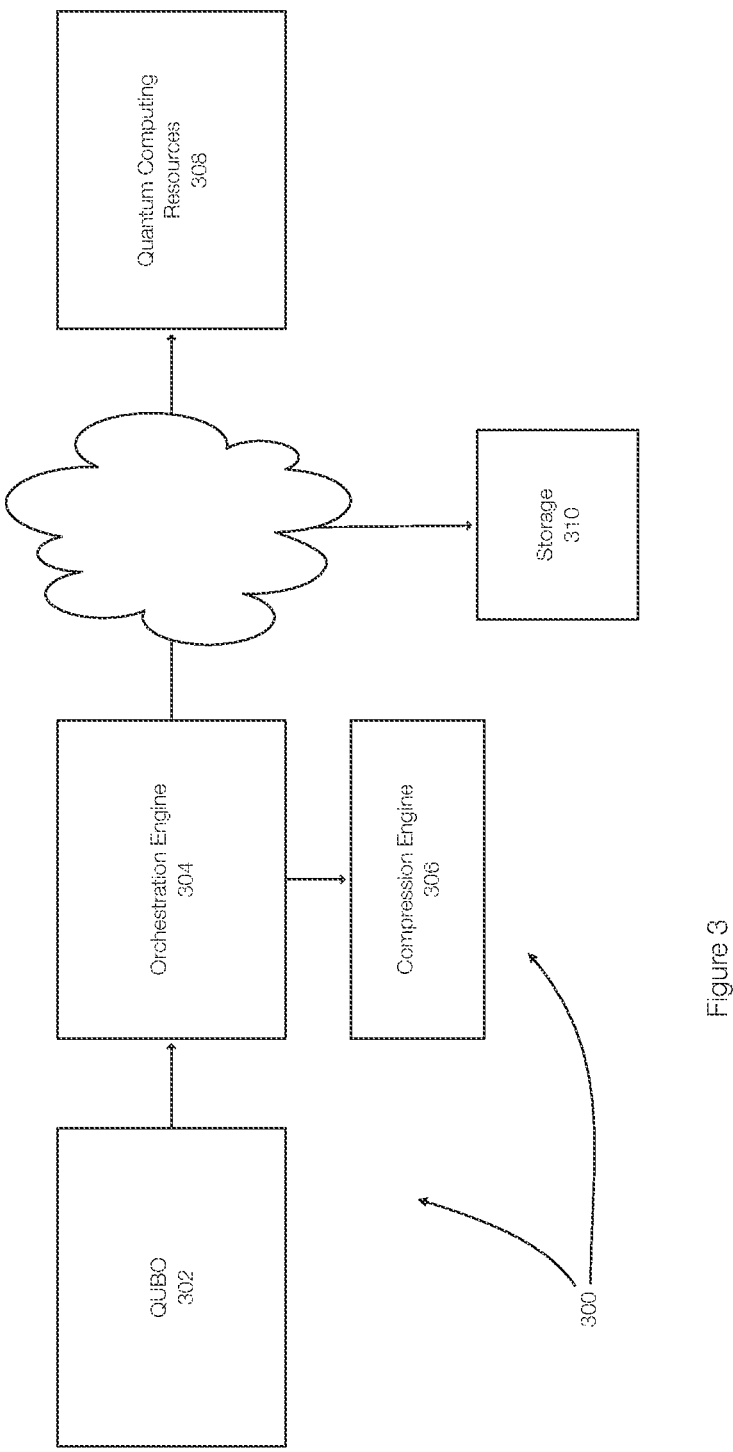
FIG. 3 discloses aspects of an orchestration engine configured to compress problem instances.

FIG. 3 discloses aspects of an orchestration engine configured to compress QUBOs or other models or problems. FIG. 3 illustrates an orchestration engine 304 configured to receive input, such as a QUBO 302, from a client. The orchestration engine 304 may include processors, memory, networking hardware, or the like. The orchestration engine 304 may be a cloud based service configured to orchestrate the execution of quantum jobs, such as the QUBO 302, in quantum computing systems including quantum annealers. The orchestration engine 304 may be cloud based or on-premise.

The orchestration engine 304 is configured to orchestrate the execution of quantum jobs. The QUBO 302, which is an example of a quantum job, may be processed by the orchestration engine 304. This may include including converting the input (if not in QUBO format) to an appropriate format, mapping the QUBO 302 to qubits, selecting a quantum computing system from among those available in the quantum computing resources 308, receiving results of execution from a quantum computing system, returning results to a client, or the like.

In one example, the orchestration engine 304 includes or is associated with a compression engine 306. The compression engine 306 may be configured to compress the QUBO 302 (and decompress the QUBO 302 if necessary). For example, the compression engine 306 may compress the QUBO 302 prior to transmitting/storing the compressed QUBO 302 in the storage 310. The orchestration engine 304 may compress the QUBO 302 using the compression engine 306 prior to transmitting the quantum computing resources 308. The quantum computing resources 308 may be provided with a compression engine that is configured to decompress the QUBO prior to execution.

The arrangement of the orchestration system 300 may vary. As such, the locations or times at which a QUBO is compressed or decompressed may depend on the arrangement of the orchestration engine 304 or the orchestration system 300 in general. For example, the storage 310 may require access via the cloud. Thus, the QUBO 302 is compressed prior to transmission to the storage 310. In one example, delivering the QUBO 302 to the quantum computing resources 308 may or may not require compression.

In one example, the orchestration engine 304 may retrieve a compressed QUBO from the storage 310, decompress the compressed QUBO, and submit the decompressed QUBO to a quantum annealer.

Figure 4A:
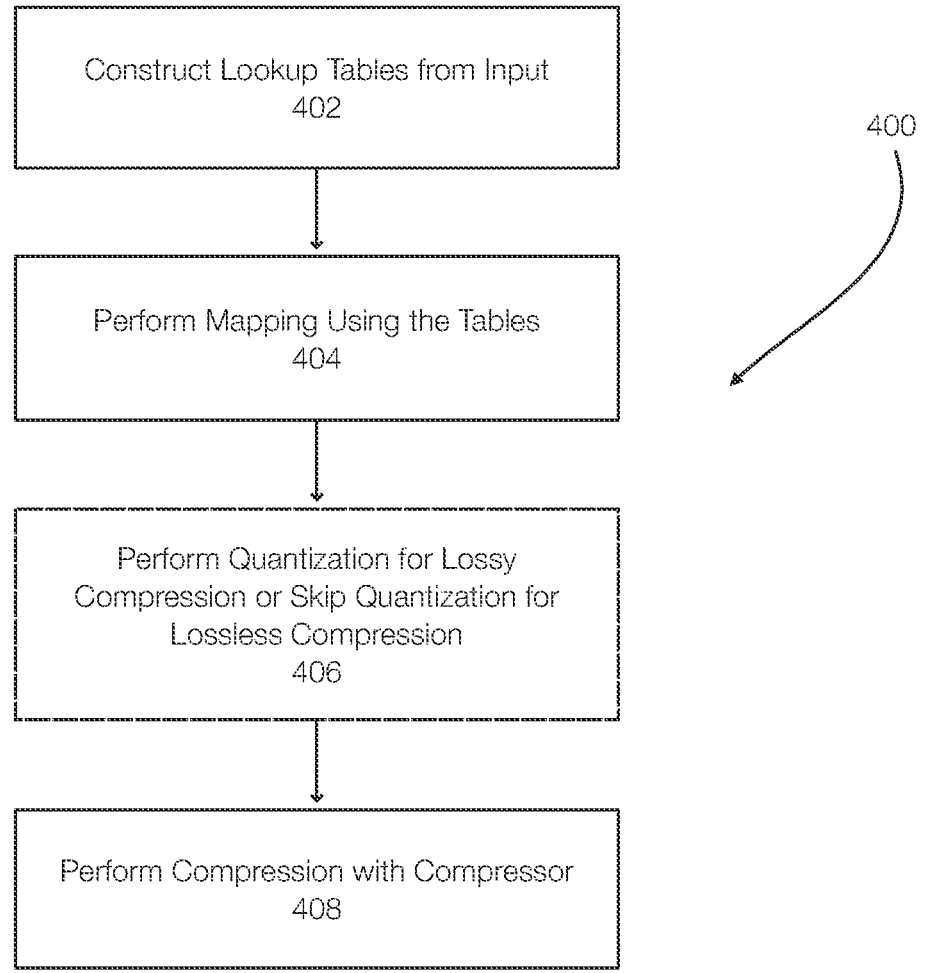
FIGS. 4A and 4B disclose aspects of compressing a problem instance in a lossy or lossless manner.
Figure 4B:
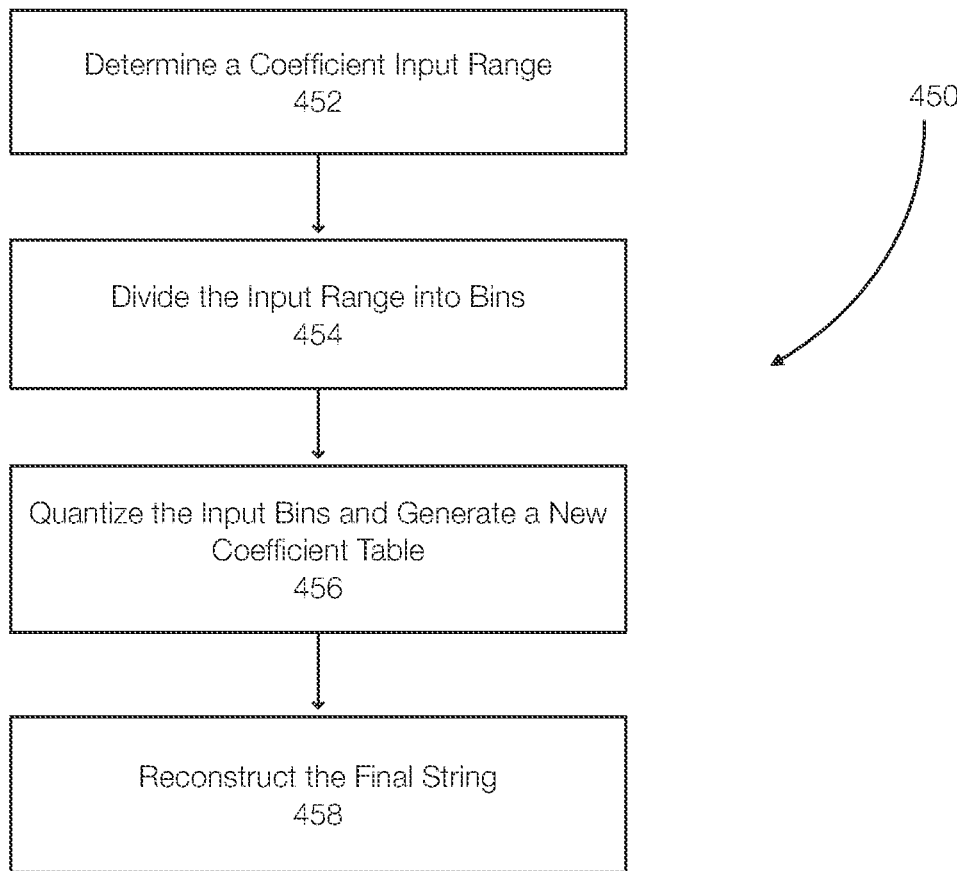

FIGS. 4A and 4B disclose aspects of compressing a QUBO in a lossy or lossless manner. The method 400 includes constructing 402 lookup tables from an input. More specifically, a QUBO, which may be represented as a string, may be received at an orchestration engine that invokes a compression operation. The orchestration engine (or the compression engine) analyzes the QUBO (e.g., the dictionaries or original string) to construct two lookup tables from the original QUBO.

The first table is a variable name table ($\Phi$). In the variable name table, all of the unique variables $v_i$ will receive a unique numeric identifier, such as an index value. The second table ($\Psi$) is analogous and is generated for the coefficients in the QUBO. In the second table, a unique identifier, such as an index value, is attached or associated with each unique coefficient $c_k$.

Once the tables are constructed, translation or mapping is performed 404 using the tables constructed from the original QUBO.

Translating or mapping the QUBO include replacing each variable name and each coefficient with their corresponding identifier (e.g., table index value). The translation or mapping operation may also group pairs of variables that have the same coefficient into a single sequence. This reduces the need to repeat the coefficients.

For example, a QUBO may include the following pairwise pairs presented as a string:

$\{(v_0, v_1): c_0, (v_1, v_2): c_0, (v_0, v_2): c_0\}$.

The identifiers for the variable names, from the table that were constructed from the original string are:

$\Phi(v_0)=0$, $\Phi(v_1)=1$, $\Phi(v_2)=2$.

The coefficient identifier, from the table is:

$\Psi(c_0)=0$.

The translated or mapped string will have the form:

$[\Phi(v_0)\_\Phi(v_1), \Phi(v_1)\_\Phi(v_2), \Phi(v_0)\_\Phi(v_2)]:\Psi(c_0)$, where '_' is used as a separator symbol.

The translated string then becomes $\{(v_0, v_1): c_0, (v_1, v_2): c_0, (v_0, v_2): c_0\} \rightarrow [0\_1,1\_2,0\_2]: 0$.

If lossy compression is used, quantization is performed 406 on the translated string, which may be a final form or a compressed result of the compression operation in one example. The quantization may be skipped if lossless compression is being performed.

FIG. 4B discloses aspects of quantization in the context of lossy compression of a QUBO. More specifically 4B illustrates an example of a quantization operation 450 that may be performed. The loss is introduced into the compression operation by quantizing the coefficients.

In one example, the operation 450 reduces the granularity of the coefficients and discards information. Because QUBOs encode the information of a problem in the coefficients, the quantization operation 450 is configured to keep more of the information represented in the coefficients that are larger in magnitude. Thus, a non-linear quantization method may be used. In one example, a quantization factor is defined as a parameter. A higher quantization factor may lead to more information loss, a larger sequence of variable pairs in the final string, and less duplication of coefficients.

In one example of the operation 450, the range of input values from the coefficient table is determined 452. Next, the input range is divided 454 into bins. In one example, the bins do not overlap. In one example, the bins may have different or various sizes. All of the coefficient values that fall within a given interval receive the value at the middle of the interval in one example. For example, if a particular interval is [1,5] then each value or coefficient that falls within this bin with be assigned the value of 3.

In one embodiment, each bin may have a second level of quantization that may depend on the importance of the interval. The non-linearity indicates, in one example embodiment, that intervals near or associated with the high magnitude values of the input range are smaller than the intervals of bins associated with lower magnitude values.

After dividing 454 the input range into bins, the input bins are quantized 456 and a new coefficient table is generated. In one example, the new coefficient table associates the middle value of each bin (e.g., a new coefficient) with a unique index value. The resulting new coefficient table replaces the original coefficient table previously constructed. The original coefficient table may be retained in some examples.

Once the new coefficient table has been constructed, the translated string is reconstructed 458 or constructed using the new coefficient table. This may be performed in two steps.

First, using the new coefficient table, a linear search is performed to map old indexes to new indexes. Thus, the translated string generated in this manner includes indexes of the updated or new coefficient table ($\hat{\Psi}$), not the original coefficient table ($\Psi$).

Second, lists of pairs with the same coefficient indexes are joined. To remove coefficient index duplication in the translated string, lists with the same coefficient indexes are joined. This ordering of this list and subsequent updates can be performed in O(n log n) time.

Returning to FIG. 4A, a general purpose entropy compressor (e.g., LZMA2 or BZip2) can be applied to (i) the resulting translated string, (ii) the variable name table $\Phi$, and (iii) the coefficient table $\Psi$ in the lossless compression case or to the new coefficient table $\hat{\Psi}$ in the lossy encoding case.

Figure 5A:
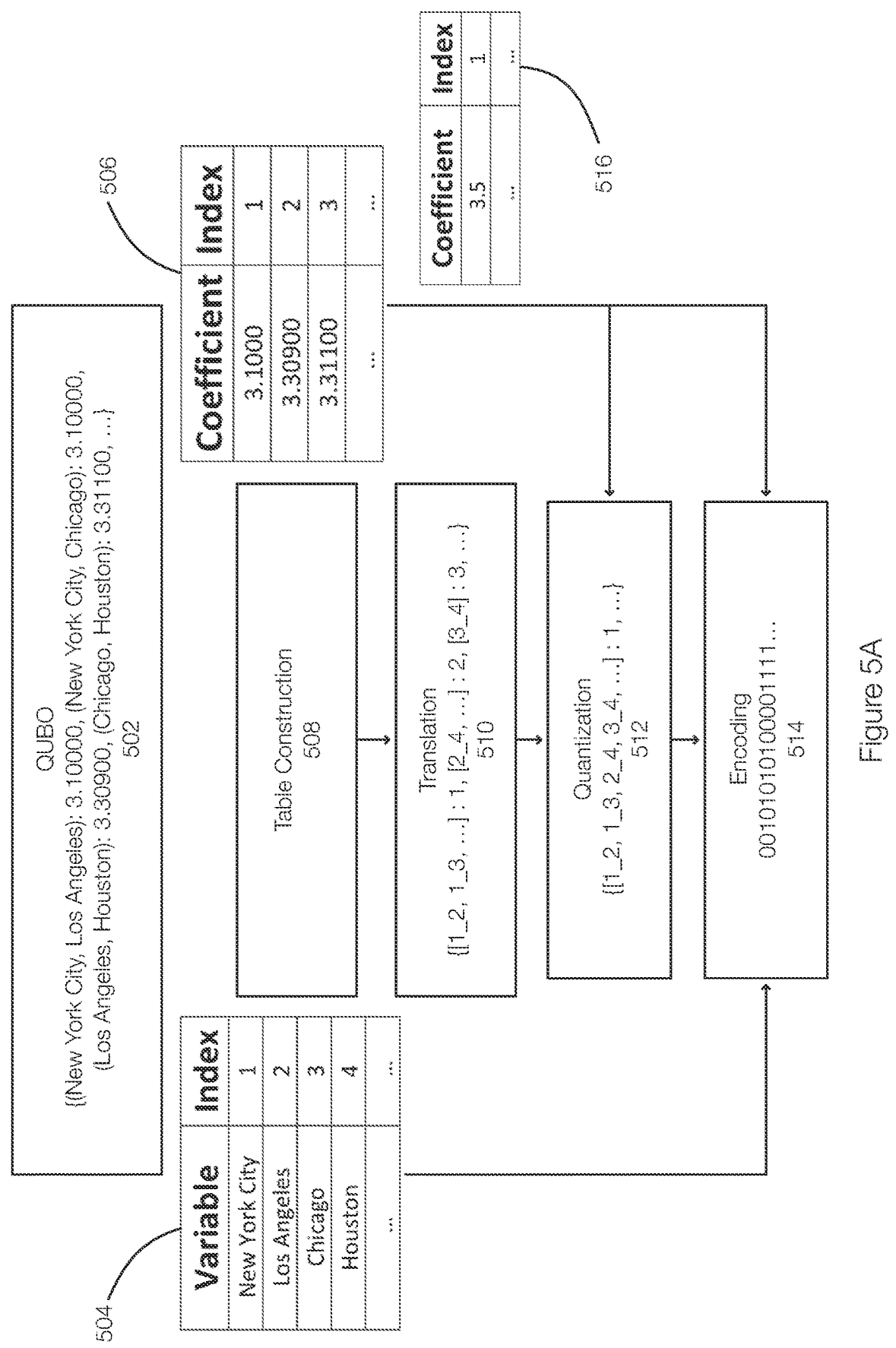
FIG. 5A discloses additional aspects of compressing a problem instance for a quantum computing system.

FIG. 5A discloses an example of lossy compression to compress a QUBO. FIG. 5A illustrates an example QUBO 502 that may be received by an orchestration engine. In this example, the QUBO 502 is represented as follows:

```
{
        (New York City, Los Angeles) : 3.10000,
        (New York City, Chicago) : 3.10000,
        (Los Angeles, Houston) : 3.30900,
        (Chicago, Houston) : 3.31100
        ...
}
```

Using information in the QUBO 502, the variable name table 504 and the coefficient table 506 are constructed. The variables New York City, Los Angeles, Chicago, and Houston, are assigned or associated with, respectively, values or index values 1, 2, 3, 4. The coefficients 3.10000, 3.30900, and 3.31100 are assigned or associated with values or index values, respectively, 1, 2, and 3.

FIG. 5A thus illustrates that the variable name table 504 and the coefficient table 506 are constructed from the QUBO 502.

Next, a mapping or translation 510 is performed. The translation or mapping replaces the variable names and coefficients with their corresponding assigned index value from the tables 504 and 506. The converts the QUBO 502 to the following representation (a translated or mapped string):

```
{
        [1_2, 1_3, ...] : 1
        [2_4, ...] : 2,
        [3_4] : 3,
        ...
}
```

If quantization 512 is performed, FIG. 5A illustrates that the translated string is further reduced to the following:

```
{
        [1_2, 1_3, 2_4, 3_4, ... : 1]
    ...
}
```

In this example of quantization 512, all of the coefficients 3.10900, 3.30900, and 3.3100 were in the same bin and associated with the same index value of 1. More specifically, the bin may have been for coefficients in an interval of 3≤coefficient<4. The middle value of value of 3.5 and an index value of 1 is generated in the new coefficient table as illustrated by the new coefficient table 516. The new coefficient value may or may not be present in the original coefficient table 506. In another example, an existing coefficient closest to the middle value from the bin is selected as the new coefficient in the new coefficient table. Other methods for selecting a representative value from a bin may be used. Thus, quantization generates a quantized result and a new coefficient table 516. Thus, quantization reduces the number of coefficients in the final translated string, and reduces the number of entries in the new or updated coefficient table 516.

FIG. 5A illustrates that, when lossless compression is performed, the original string (e.g., the QUBO 502) is translated into a translated string 510. When lossy compression is performed, the original string is translated into a translated string 512 after quantization.

FIG. 5A also illustrates that the result of quantization 512 (if lossy compression being performed) or the result of translation 510 (if lossless compression being performed) along with the variable table 502 and the coefficient table 516 (when lossy compression performed) or the coefficient table 506 (when lossless compression performed) are encoded together using, in one example, an entropy compressor. The resulting compressed or result string (0010101010000111 . . . ) is an illustrative example of a compressed QUBO 502.

Using the tables 504 and 506 (or 516), the QUBO can be recovered by decompressing the compressed QUBO to generate the QUBO 502. However, if quantization was performed, the QUBO resulting from the decompression is different from the QUBO 502 as some information may have been lost.

For example, a decompression functionality could be integrated with the orchestration engine. The decompression functionality would traverse the tables created in the compression operation and restore the values found in the original QUBO formulation string on the go. This cannot be performed using general-purpose compressors, which require the entire string to be regenerated (i.e., decompressed) before being provided to the orchestration engine.

Embodiments of the invention compress the input problem instance in a manner that obtains various advantages compared to simply applying a general-purpose entropy encoding compressor to the QUBO 502. The benefit in compression increases in proportion to the average size of the variable name and with higher quantization values.

In some embodiments, the encoding 514 (or 408) may be omitted in order to improve the readiness of the QUBO. More specifically, omitting the encoding 514 allows decompression to be performed from the translated string by replacing the index values in the translated string with their corresponding values from the variable name table and the coefficient table, which operation can be performed on the fly.

FIG. 5B discloses aspects of a gain achieved by compressing a problem instance such as a QUBO. In these examples, the QUBOs were randomly generated and had 5000 qubits (or binary variables) as illustrated in column 1 of FIG. 5B The table 550 illustrates various aspects that may impact the gain of compressing a QUBO. The maxsize_variable_name represents that maximum number of characters that a variable name may have. A quantization factor of 0.0 indicates that no coefficient was quantized (and no data was lost). Thus, a quantization factor of 0.0 is a lossless compression.

The original size indicates the original size in Megabytes of an input problem such as a QUBO. The 7z represents an entropy encoding (e.g., LZMA/LZMA2) applied to the original QUBO. The column 7z+algo represents compression in accordance with embodiments of the invention using the variable name and coefficient tables. As illustrated, embodiments of the invention, performed in both lossless and lossy manners, achieves a higher compression gain compared to entropy encoding alone. Further larger variable names and higher density typically achieved better results.

It is noted that embodiments of the invention, whether claimed or not, cannot be performed, practically or otherwise, in the mind of a human. Accordingly, nothing herein should be construed as teaching or suggesting that any aspect of any embodiment of the invention could or would be performed, practically or otherwise, in the mind of a human. Further, and unless explicitly indicated otherwise herein, the disclosed methods, processes, and operations, are contemplated as being implemented by computing systems that may comprise hardware and/or software. That is, such methods processes, and operations, are defined as being computer-implemented.

The following is a discussion of aspects of example operating environments for various embodiments of the invention. This discussion is not intended to limit the scope of the invention, or the applicability of the embodiments, in any way.

In general, embodiments of the invention may be implemented in connection with systems, software, and components, that individually and/or collectively implement, and/or cause the implementation of, data protection operations which may include, but are not limited to, gated quantum computing operations, quantum annealing operations, compression operations, quantization operations, decompression operations, table construction operations, translation operations, or the like or combination thereof. More generally, the scope of the invention embraces any operating environment in which the disclosed concepts may be useful.

New and/or modified data collected and/or generated in connection with some embodiments, may be stored in a data storage environment that may take the form of a public or private cloud storage environment, an on-premises storage environment, and hybrid storage environments that include public and private elements. Any of these example storage environments, may be partly, or completely, virtualized. The storage environment may comprise, or consist of, a datacenter which is operable to perform operations initiated by one or more clients or other elements of the operating environment.

Example cloud computing environments, which may or may not be public, include storage environments that may provide data protection functionality for one or more clients. Another example of a cloud computing environment is one in which processing, data protection, and other, services may be performed on behalf of one or more clients. Some example cloud computing environments in connection with which embodiments of the invention may be employed include, but are not limited to, Microsoft Azure, Amazon AWS, Dell EMC Cloud Storage Services, and Google Cloud. More generally however, the scope of the invention is not limited to employment of any particular type or implementation of cloud computing environment.

In addition to the cloud environment, a particular client may employ, or otherwise be associated with, one or more instances of each of one or more applications that perform such operations with respect to data. Such clients may comprise physical machines, containers, or virtual machines (VMs).

Particularly, devices in the operating environment may take the form of software, physical machines, containers, or VMs, or any combination of these, though no particular device implementation or configuration is required for any embodiment. Similarly, data storage system components such as databases, storage servers, storage volumes (LUNs), storage disks, and the like, may take the form of software, physical machines, containers, or virtual machines (VM), though no particular component implementation is required for any embodiment.

Example embodiments of the invention are applicable to any system capable of storing and handling various types of objects, in analog, digital, or other form.

It is noted that any operation(s) of any of these methods, may be performed in response to, as a result of, and/or, based upon, the performance of any preceding operation(s). Correspondingly, performance of one or more operations, for example, may be a predicate or trigger to subsequent performance of one or more additional operations. Thus, for example, the various operations that may make up a method may be linked together or otherwise associated with each other by way of relations such as the examples just noted. Finally, and while it is not required, the individual operations that make up the various example methods disclosed herein are, in some embodiments, performed in the specific sequence recited in those examples. In other embodiments, the individual operations that make up a disclosed method may be performed in a sequence other than the specific sequence recited.

Following are some further example embodiments of the invention. These are presented only by way of example and are not intended to limit the scope of the invention in any way.

Embodiment 1. A method comprising: constructing lookup tables for a problem received at an orchestration engine, translating the problem to a translated string using identifiers stored in the lookup tables, and compressing the translated string and the lookup tables into a result string.

Embodiment 2. The method of embodiment 1, wherein the lookup tables include a variable name table that associates each unique variable name with an index value and wherein the lookup tables include a coefficient table that associates each unique coefficient with an index value.

Embodiment 3. The method of embodiment 1 and/or 2, wherein translating the problem instance comprises generating the translated string by replacing the variable names with their corresponding index values and replacing the coefficients with their corresponding index values.

Embodiment 4. The method of embodiment 1, 2, and/or 3, further comprising compressing the translated string and the lookup tables into the result string with an entropy compressor.

Embodiment 5. The method of embodiment 1, 2, 3, and/or 4, wherein the result string comprises a binary string.

Embodiment 6. The method of embodiment 1, 2, 3, 4, and/or 5, further comprising quantizing the translated string.

Embodiment 7. The method of embodiment 1, 2, 3, 4, 5, and/or 6, further comprising determining an input range of coefficients from a coefficient table included in the lookup tables.

Embodiment 8. The method of embodiment 1, 2, 3, 4, 5, 6, and/or 7, further comprising dividing the input range into non-overlapping bins of varied sizes.

Embodiment 9. The method of embodiment 1, 2, 3, 4, 5, 6, 7, and/or 8, wherein sizes of bins associated with higher magnitude coefficients are smaller than sizes of bins associated with lower magnitude coefficients.

Embodiment 10. The method of embodiment 1, 2, 3, 4, 5, 6, 7, 8, and/or 9, further comprising generating a new coefficient table using a middle value of each bin and reconstructing the translated string by: mapping index values in the coefficient table to new index values in the new coefficient table, and joining lists of pairs with the new coefficient index values.

Embodiment 11 A system, comprising hardware and/or software, operable to perform any of the operations, methods, or processes, or any portion of any of these, disclosed herein.

Embodiment 12 A non-transitory storage medium having stored therein instructions that are executable by one or more hardware processors to perform operations comprising the operations of any one or more of embodiments 1-10.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term module, component, engine, agent, service, or the like may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 6:
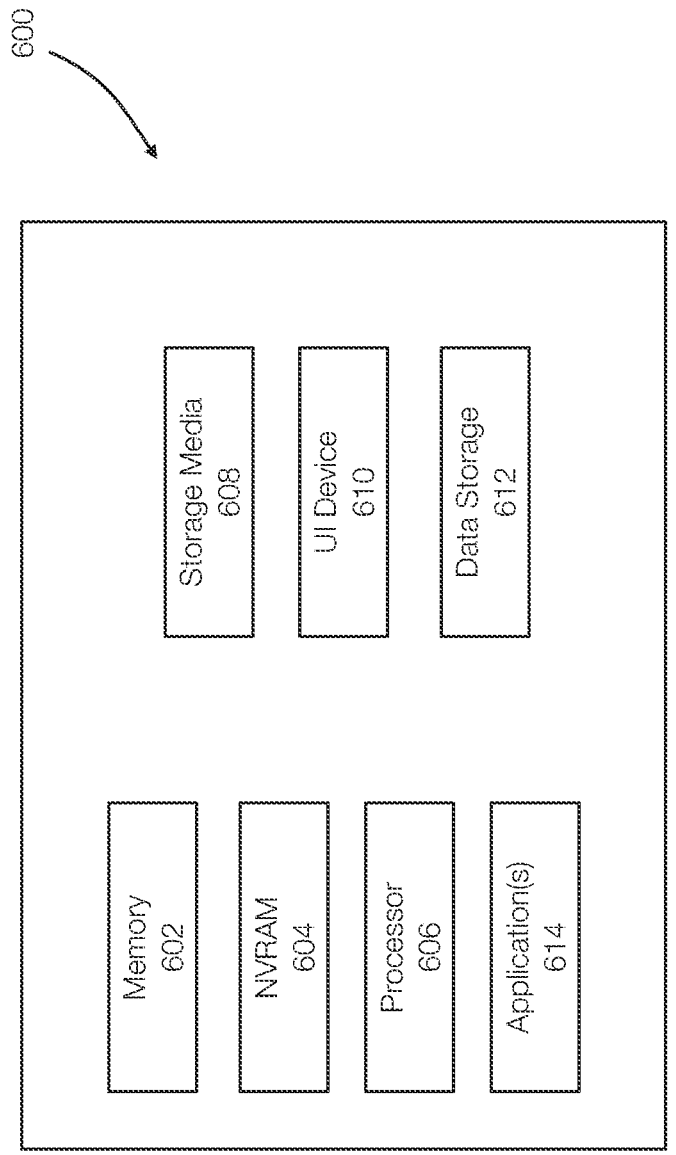
FIG. 6 discloses aspects of a computing device, system, or entity.

With reference briefly now to FIG. 6, any one or more of the entities disclosed, or implied, by the Figures and/or elsewhere herein, may take the form of, or include, or be implemented on, or hosted by, a physical computing device, one example of which is denoted at 600. As well, where any of the aforementioned elements comprise or consist of a virtual machine (VM), that VM may constitute a virtualization of any combination of the physical components disclosed in FIG. 6.

In the example of FIG. 6, the physical computing device 600 includes a memory 602 which may include one, some, or all, of random access memory (RAM), non-volatile memory (NVM) 604 such as NVRAM for example, read-only memory (ROM), and persistent memory, one or more hardware processors 606, non-transitory storage media 608, UI device 610, and data storage 612. One or more of the memory components 602 of the physical computing device 600 may take the form of solid state device (SSD) storage. As well, one or more applications 614 may be provided that comprise instructions executable by one or more hardware processors 606 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The device 600 may represent a server, a service, or the like. For example, the orchestration engine may be implemented as a computing system that is cloud-based or on-premise based. Client device may submit QUBOs to the orchestration engine. In some examples, the clients may be able to compress the QUBOs. The orchestration engine may also be able to compress the QUBOs or other input.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   constructing lookup tables for a problem received at an orchestration engine, wherein the lookup tables include a variable name table that associates each unique variable name with an index value and wherein the lookup tables include a coefficient table that associates each unique coefficient with an index value;
   translating the problem to a translated string using identifiers stored in the lookup tables; and
   compressing the translated string and the lookup tables into a result string.

2. The method of claim 1, wherein translating the problem instance comprises generating the translated string by replacing the variable names with their corresponding index values and replacing the coefficients with their corresponding index values.

3. The method of claim 2, further comprising compressing the translated string and the lookup tables into the result string with an entropy compressor.

4. The method of claim 3, wherein the result string comprises a binary string.

5. The method of claim 1, further comprising quantizing values in one or more of the lookup tables prior to generating the translated string.

6. The method of claim 5, further comprising determining an input range of coefficients from a coefficient table included in the lookup tables.

7. The method of claim 6, further comprising dividing the input range into non-overlapping bins of varied sizes.

8. The method of claim 7, wherein sizes of bins associated with higher magnitude coefficients are smaller than sizes of bins associated with lower magnitude coefficients.

9. The method of claim 8, further comprising generating a new coefficient table using a middle value of each bin and reconstructing the translated string by:
   mapping index values in the coefficient table to new index values in the new coefficient table; and
   joining lists of pairs with the new coefficient index values.

10. A non-transitory storage medium having stored therein instructions that are executable by one or more hardware processors to perform operations comprising:
   constructing lookup tables for a problem received at an orchestration engine, wherein the lookup tables include a variable name table that associates each unique variable name with an index value and wherein the lookup tables include a coefficient table that associates each unique coefficient with an index value;
   translating the problem to a translated string using identifiers stored in the lookup tables; and
   compressing the translated string and the lookup tables into a result string.

11. The non-transitory storage medium of claim 10, wherein translating the problem instance comprises generating the translated string by replacing the variable names with their corresponding index values and replacing the coefficients with their corresponding index values.

12. The non-transitory storage medium of claim 11, further comprising compressing the translated string and the lookup tables into the result string with an entropy compressor.

13. The non-transitory storage medium of claim 12, wherein the result string comprises a binary string.

14. The non-transitory storage medium of claim 10, further comprising quantizing the translated string.

15. The non-transitory storage medium of claim 14, further comprising determining an input range of coefficients from a coefficient table included in the lookup tables.

16. The non-transitory storage medium of claim 15, further comprising dividing the input range into non-overlapping bins of varied sizes.

17. The non-transitory storage medium of claim 16, wherein sizes of bins associated with higher magnitude coefficients are smaller than sizes of bins associated with lower magnitude coefficients.

18. The non-transitory storage medium of claim 17, further comprising generating a new coefficient table using a middle value of each bin and reconstructing the translated string by:
   mapping index values in the coefficient table to new index values in the new coefficient table; and
   joining lists of pairs with the new coefficient index values.

* * * * *